HIGH SPEED TRANSISTOR MULTIVIBRATOR

Filed Feb. 19, 1959

INVENTOR.
MARIO M. FORTINI
BY
Herbert Epstein
AGENT

United States Patent Office 2,997,605

Patented Aug. 22, 1961

2,997,605

HIGH SPEED TRANSISTOR MULTIVIBRATOR

Mario M. Fortini, Hatboro, Pa., assignor to Philco Corporation, Philadelphia, Pa., a corporation of Pennsylvania Filed Feb. 19, 1959, Ser. No. 794,293

13 Claims. (Cl. 307—88.5)

Figure 1:
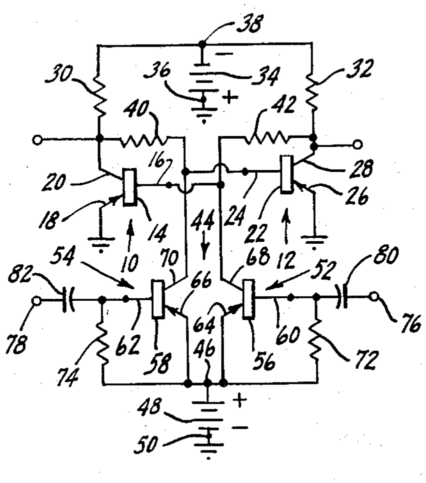

This invention relates to semiconductor apparatus and more particularly to multivibrators employing transistors as their active elements, wherein it is desired to effect rapid on-off operations of the transistors.

Heretofore transistor multivibrators of the saturating type have been characterized by a disadvantageously slow switching time from one conduction state to the other. This slow switching time results from the storage of minority carriers by the base element of a saturated transistor. This storage occurs because the emitter of a saturated transistor injects minority carriers into its base element faster than the collector can withdraw them therefrom. As a result even when minority-carrier injection is terminated, e.g. by establishing the emitter potential at a value substantially equal to that of the base element, there is still a relatively large excess of minority carriers remaining in the base element of the transistor. As a result collector current continues to flow until this excess has been eliminated. Accordingly in conventional saturated transistor multivibrators a substantial time interval normally elapses between the time when minority-carrier injection ceases in the conductive transistor and the time when the collector current of the transistor ceases to flow. Such multivibrators are therefore normally characterized by relatively long switching times between conduction states. As a result saturated-transistor multivibrators, although advantageous because of their relatively large-amplitude signal output, have heretofore been usable only in relatively low-frequency applications.

Accordingly it is an object of the present invention to provide an improved transistor multivibrator.

Another object is to provide an improved saturating transistor multivibrator.

Another object is to provide an improved staturating transistor multivibrator having a substantially shorter transition time than do prior-art transistor multivibrators.

Another object is to provide an improved saturating transistor multivibrator which requires anly conventional, readily obtainable components and yet is characterized by a substantially shorter transition time than prior-art transistor multivibrators even of the non-saturating type.

Another object is to provide such an improved transistor multivibrator which is inexpensive to build.

In accordance with the present invention, rapid turn-off of each transistor of the multivibrator is effected by quickly dispelling the aforementioned stored minority carriers from each transistor at the instant of turn-off of the transistor, i.e. at the instant when minority-carrier injection is terminated, thereby to terminate abruptly the flow of collector current. In one preferred embodiment of the invention, as hereinafter described, the stored minority carriers are dispelled by reverse biasing the base-emitter path of the initially conducting transistor and by establishing a low impedance drainage path for said carriers. In another preferred embodiment of the invention an additional biasing potential is provided which serves to effect abrupt turn-on of the initially non-conducting transistor at the same time that the reverse-biasing potential is effecting rapid turn-off of the initially conducting transistor.

Further still, in each preferred embodiment of the invention, rapid turn-off of the conducting transistor of the multivibrator is achieved by the utilization of auxiliary switching transistors each of which not only serves to apply the reverse-biasing potential but also is instrumental in establishing the low-impedance drainage path.

Other objects and features of the invention will be apparent from the following detailed description of a number of embodiments thereof.

Figure 3:
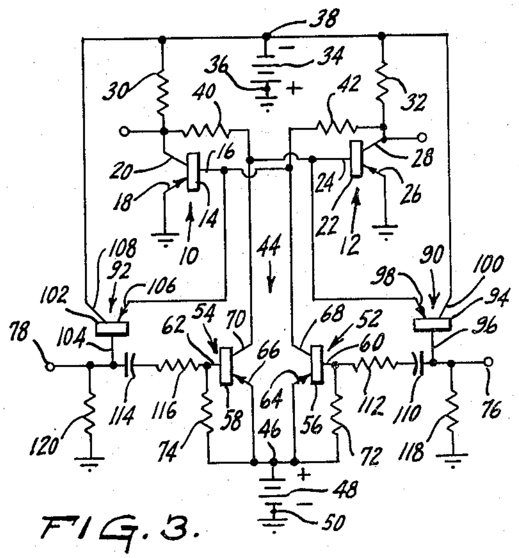
Figure 2:
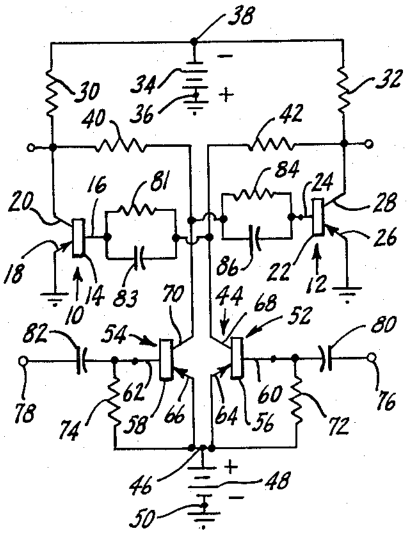
Figure 4:
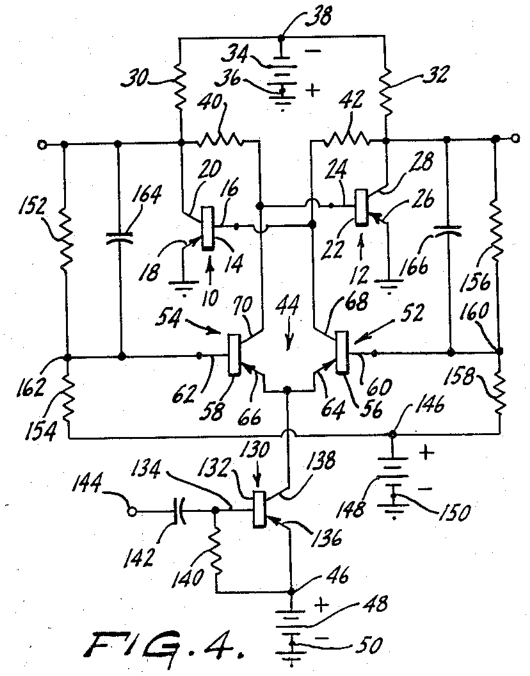

In the accompanying drawing FIGURES 1 to 3 are schematic diagrams of multivibrators according to the invention, and FIGURE 4 is a schematic diagram of a scale-of-two or binary counter employing a multivibrator according to the invention.

FIGURE 1 illustrates a preferred version of the improved transistor multivibrator of the invention, comprising first and second transistors 10 and 12 respectively. First transistor 10 comprises a base element 14, a base electrode 16 connected thereto, an emitter electrode 18 and a collector electrode 20; and second transistor 12 similarly comprises a base element 22, a base electrode 24 connected thereto, an emitter electrode 26 and a collector electrode 28. The base elements 14 and 22 of transistors 10 and 12 are of the same conductivity type and in the following discussion are designated as n-type.

Emitter electrodes 18 and 26 are connected directly to a point at reference potential, and collector electrodes 20 and 28 respectively are connected via resistive elements 30 and 32 respectively to a source of operating voltage. The latter source may be a battery 34 having its positive terminal 36 connected to a point at reference potential and its negative terminal 38 connected to each of resistive elements 30 and 32.

In addition, collector electrode 20 of first transistor 10 is connected to base electrode 24 of second transistor 12 by way of a resistive element 40, while collector electrode 28 of second transistor 12 is similarly connected to base electrode 16 of first transistor 10 by way of a resistive element 42. To obtain symmetrical operation transistors 10 and 12 are preferably of the same type, resistive element 30 has a resistance substantially equal to that of resistive element 32 and resistive element 40 has a resistance substantially equal to that of resistive element 42. As thus far described the multivibrator is conventional.

In accordance with a preferred embodiment of the invention, an arrangement designated generally by reference numeral 44 is provided to effect the desired rapid switching of transistors 10 and 12. In this arrangement a battery 48 has its negative terminal 50 connected to a point at reference potential, and its positive terminal 46 is a source of switching and reverse-biasing potential for transistors 10 and 12. This potential is applied to a first switching means connected between the positive terminal 46 of battery 48 and the base electrode 16 of first transistor 10, and a second switching means connected between terminal 46 and base electrode 24 of second transistor 12. Each of these switching means is controllable to apply to the base electrode to which it is connected the switching potential supplied by battery 48. Moreover when it is so controlled it has an impedance such that the sum of the latter impedance and that of battery 48 is less than the resistance of the internal base-emitter path of the transistor to whose base it is connected, when the latter path is forward-biased.

In the specific embodiment of FIGURE 1, the first and second switching means respectively comprise third and fourth transistors 52 and 54 respectively having base elements 56 and 58 of the same conductivity type as base elements 14 and 22 of transistors 10 and 12, i.e. n-type in this specific example, base electrodes 60 and 62 respectively connected to base elements 56 and 58, emitter electrodes 64 and 66, and collector electrodes 68 and 70. Emitter electrodes 64 and 66 are both connected directly to the positive terminal 46 of battery 48. Collector electrode 68 of third transistor 52 is connected directly to base electrode 16 of first transistor 10, and collector electrode 70 of fourth transistor 54 is connected directly to base electrode 24 of second transistor 12. To maintain the third and fourth transistors 52 and 54 in a normally non-conductive state, base and emitter electrodes 60 and 64 are interconnected by a resistive element 72, and base and emitter electrodes 62 and 66 are interconnected by a resistive element 74. To render the transistors 52 and 54 conductive, input signals are applied to input terminals 76 and 78 which are connected to base electrodes 60 and 62 respectively by way of blocking capacitors 80 and 82 respectively.

The operation of the multivibrator of FIGURE 1 will now be described assuming that initially first transistor 10 is heavily conducting and all of the other transistors are substantially non-conducting. Under these conditions the collector potential of first transistor 10 is almost equal to the reference potential because the resistance between its emitter and collector electrodes 18 and 20 is very low. Accordingly the potential of base electrode 24 of second transistor 12 is also almost equal to reference potential, and since its emitter electrode 26 is connected to a point at reference potential, transistor 12 is substantially non-conductive.

To switch the multivibrator to its other state in which second transistor 12 is heavily conductive and first transistor 10 is subsantially non-conductive, a gating potential of polarity appropriate to cause third transistor 52 to conduct heavily is applied to its base electrode 60 via input terminal 76 and blocking capacitor 80. Because transistor 52 has an n-type base element 56, a negative-going pulse driving the potential of base electrode 60 below that of positive terminal 46 of battery 48 provides an appropriate gating potential.

When third transistor 52 becomes heavily conductive, the resistance between its emitter and collector electrodes 64 and 68 falls from a very high to a very low value such that the sum of such resistance and the resistance of battery 48 is substantially smaller than the resistance of the internal base-emitter path of conductive transistor 10. Typically the latter resistance may be 15 times higher than said sum.

Under these conditions a switching potential substantially equal to that of positive termnial 46 of battery 48 is applied to base electrode 16 of first transistor 10. Because this switching potential is positive with respect to the reference potential applied to emitter electrode 18 the internal base-emitter path of transistor 10 is reverse-biased. As a result the injection by the emitter of minority carriers, i.e. holes, into base element 14 ends immediately. Moreover the low-resistance circuit connected between base and emitter electrodes 16 and 18 of transistor 10 acts as a highly efficient drain for the holes stored within base element 14 at the time hole injection ends. Thus stored minority carriers are rapidly removed from base element 14 not only by way of collector electrode 20 but also even more efficiently by way of emitter electrode 18. Consequently transistor 10 is very rapidly changed from a heavily conductive to a substantially non-conductive condition. As a result the potential of collector electrode 20 rapidly assumes a value substantially negative with respect to reference potential. This collector potential is applied by way of resistive element 40 to base electrode 24 of second transistor 12, thereby forward-biasing the base-emitter path thereof and rendering the latter transistor heavily conducting, and hence completing the transition of the multivibrator from one conduction state to the other.

Moreover the positive potential applied by third transistor 52 to the base electrode 16 of first transistor 10 is also applied to resistive element 42. As a result the potential of collector electrode 28 of non-conductive second transistor 12 is immediately raised to a positive potential close to that which it will assume when transistor 12 finally becomes heavily conducting in response to the switching off of first transistor 10. Indeed by proportioning the values of the circuit components in the manner now to be described it is feasible to cause collector electrode 28 immediately to assume precisely this final potential in response to the input pulse supplied to third transistor 52.

More particularly let $R_{in}$ represent the resistance between the emitter and base electrodes of either transistor 10 or 12 when that transistor is conducting heavily. In addition let $I_B$ represent the intensity of the base current and $I_C$ the intensity of the collector current of such a heavily conducting transistor. Moreover let $R_L$ represent the resistance of each of resistive elements 30 and 32, $R_B$ the resistance of each of resistive elements 40 and 42, $V_1$ the terminal voltage of battery 34 and $V_2$ the terminal voltage of battery 48. Then, to establish the collector potential of the initially "off" transistor at substantially the value which it will have when the latter transistor is heavily conducting, it is only necessary that the values of the circuit components of the multivibrator of FIGURE 1 substantially satisfy the following relationships:

$$R_L = V_1/I_C$$
$$R_B = (I_C/I_B - 1)R_L - R_{in}$$
$$V_2 = R_B I_C$$

The above description of operation is with reference to turn-off of transistor 10 and turn-on of transistor 12. It will be understood that turn-off of transistor 12 and turn-on of transistor 10, in response to a negative-going pulse supplied to terminal 78, is similar and involves rapid removal of stored minority carries from base 22 of transistor 12.

In a specific example, the components of the multivibrator of FIGURE 1 may have the following values:

| | |
|---|---|
| Transistors **10**, **12**, **52** and **54** | Each a Philco Type SB-100. |
| Resistors **30** and **32** | Each 330 ohms. |
| Resistors **40** and **42** | Each 820 ohms. |
| Resistors **72** and **74** | Each 1.2 kilohms. |
| Capacitors **80** and **82** | Each 470 micromicrofarads. |
| Battery **34** | 3.0 volts. |
| Battery **48** | 6.5 volts. |

It is to be understood that the foregoing numerical values are merely exemplary and that the invention is not limited thereto. Where such values are used, the switching delay attributable to hole storage is reduced to only 9 millimicroseconds and the rise time of the collector potential of the switched-off transistor is only 9 millimicroseconds giving a total switching delay of only 18 millimicroseconds. This total switching delay is substantially smaller than those heretofore exhibited by prior-art multivibrators of either the saturating or non-saturating types utilizing the same transistors. Moreover the amplitude of the output pulse developed at each of collector electrodes 20 and 28 is 2.5 volts, i.e. as high as 83 percent of the collector supply voltage.

FIGURE 2 illustrates another multivibrator circuit according to the present invention. This circuit differs from the arrangement of FIGURE 1 only in the manner in which the collector electrode of each of transistors 10 and 12 is coupled to the base electrode of the other of said transistors. The reason for the modification in FIGURE 2 is that the emitter-base diodes of certain types of transistors, e.g. graded-base transistors, cease to rectify efficiently, that is they "breakdown" when a back-biasing voltage applied thereacross exceeds a relatively small value. Such breakdown is undesirable because it may permit a base current to flow which is sufficiently intense to damage the transistor. However even such transistors are relatively resistant to breakdown so long as a substantial quantity of minority carriers is stored in their base elements.

In FIGURE 2 networks 81, 83 and 84, 86 are provided to insure against such breakdown, each network comprising a resistor shunted by a capacitor. Due to the capacitor of the impedance of each network with respect to the sharply-rising leading edge of the switching voltage supplied by switching means 44 is low. As a result substantially the entire voltage of battery 48 is initially applied to the base electrode of the heavily-conducting transistor, thereby causing efficient drainage of stored minority carriers from the base element thereof but tending to cause breakdown at the time when most stored carriers shall have been drained. However by that time most of the current flowing in the base-emitter circuit of the transistor flows through the resistor of the network and very little of the current flows through the capacitor thereof. To this end each of the resistor-capacitor networks is constructed to have a time constant comparable to the time required to remove the stored minority carriers. Because the resistor has an appropriately high value the base-emitter voltage and current of the switched transistor are limited to safely low intensities.

In a specific embodiment the components of the multivibrator of FIGURE 2 have the following values:

| | |
|---|---|
| Transistors 10, 12, 52 and 54 | Each a Philco Type 2N501. |
| Resistors 30 and 32 | Each 150 ohms. |
| Resistors 40 and 42 | Each 220 ohms. |
| Resistor-capacitor networks: | |
| Resistors 81 and 84 | Each 220 ohms. |
| Capacitors 83 and 86 | Each 47 micromicrofarads. |
| Resistors 72 and 74 | Each 47 kilohms. |
| Capacitors 80 and 82 | Each 470 micromicrofarads. |
| Battery 34 | 3 volts. |
| Battery 48 | 7.5 volts. |

The latter arrangement exhibits a total switching time of the order of only 13 millimicroseconds. It is to be understood that the foregoing values are merely exemplary and that the invention is not limited thereto.

FIGURE 3 illustrates another multivibrator according to the invention which, by utilizing a switching circuit including two additional transistors, achieves transition from one conduction state to the other which is even more rapid than that achieved in the multivibrators of FIGURES 1 and 2. This more rapid transition is achieved because, during each switching operation, one of these additional transistors acts to turn "on" the initially "off" transistor 10 or 12 at the same time that one of transistors 52 and 54 acts to turn "off" the initially "on" transistor 12 or 10.

More particularly and as shown in FIGURE 3 switching means 44 additionally comprises fifth and sixth transistors 90 and 92 respectively. Fifth transistor 90 comprises a base element 94 having the same conductivity type as the base elements of transistors 10, 12, 52 and 54, i.e. n-type, a base electrode 96 connected to element 94, an emitter electrode 98 and a collector electrode 100; and sixth transistor 92 comprises a base element 102 also having the same conductivity type as that of the other transistors, a base electrode 104 connected to element 102, an emitter electrode 106 and a collector electrode 108. The collector electrodes 100 and 108 of fifth and sixth transistors 90 and 92 respectively are connected directly to negative terminal 38 of battery 34. In addition the emitter electrode 98 of fifth transistor 90 is connected directly to base electrode 24 of second transistor 12, and the emitter electrode 106 of sixth transistor 92 is connected directly to base electrode 16 of first transistor 10.

Moreover means are provided for connecting base electrode 96 of fifth transistor 90 to base electrode 60 of third transistor 52 and to input terminal 76. These means comprise a blocking capacitor 110 having one terminal connected to input terminal 76 and base electrode 96, and a voltage-dividing resistor 112 connected between the other terminal of capacitor 110 and base electrode 60. Means are also provided for connecting base electrode 104 of sixth transistor 92 to base electrode 62 of fourth transistor 54 and to input terminal 78. The latter means comprise a blocking capacitor 114 having one terminal connected to input terminal 78 and base electrode 104, and a voltage-dividing resistor 116 connected between the other terminal of capacitor 114 and base electrode 62. To maintain transistors 90 and 92 in a normally non-conductive condition, resistive elements 118 and 120 respectively are connected between base electrodes 96 and 104 respectively and a point at reference potential.

The operation of the arrangement of FIGURE 3, while similar to that of FIGURE 1, differs in the important respect that the appropriate additional transistor 90 or 92 of FIGURE 3 renders heavily conductive the then non-conductive one of first and second transistors 10 and 12 at the same time that the switching transistor 52 or 54 associated with the additional transistor is rendering non-conductive the conductive one of transistors 10 and 12. As a result the turning "on" of the initially non-conductive transistor is not delayed by even the short time required to drain stored minority carriers from the base element of the initially conductive transistor but rather is turned "on" independently of the latter transistor. As a result the overall transition time of the multivibrator of FIGURE 3 is reduced even below those of the multivibrators of FIGURES 1 and 2.

To illustrate, assume that initially first transistor 10 is conductive and second transistor 12 is non-conductive. To change these conduction states a negative-going gating pulse is supplied via input terminal 76 to base electrodes 60 and 96 of third and fifth transistors 52 and 90 respectively. As already described with reference to FIGURE 1, third transistor 52 conducts heavily in response to the gating pulse and effects rapid turn-off of transistor 10. In FIGURE 3 the input pulse additionally causes fifth transistor 90 immediately to become heavily conductive and the emitter-collector resistance thereof immediately falls to a very small value. As a result substantially the entire voltage of battery 34 is applied in a forward-biasing direction between the base and emitter electrodes 24 and 26 of second transistor 12, and the latter transistor is immediately driven into heavy conduction independently of first transistor 10.

As a result of the foregoing action there is produced at collector electrode 28 of second transistor 12 a pulse having an extremely short rise time, e.g. 1.3 millimicroseconds. Moreover because each of transistors 52 and 90 has power gain, a less powerful input signal can be used to trigger the multivibrator of FIGURE 3 than can be used to trigger the multivibrators of FIGURES 1 and 2. Accordingly the circuit of FIGURE 3 is particularly advantageous in computers where numerous multivibrator stages are to be switched at a very high frequency by a single input signal.

In a specific embodiment the components of the multivibrator of FIGURE 3 have the following values:

| | |
|---|---|
| Transistors 10, 12, 52, 54, 90 and 92 | Each a Philco Type 2N501. |
| Resistors 30 and 32 | Each 150 ohms. |
| Resistors 40 and 42 | Each 680 ohms. |
| Resistors 72 and 74 | Each 10 kilohms. |
| Resistors 112 and 116 | Each 150 ohms. |
| Resistors 118 and 120 | Each 50 ohms. |
| Capacitors 110 and 114 | Each 0.01 microfarad. |
| Battery 34 | 4.5 volts. |
| Battery 48 | 3.0 volts. |

It is to be understood that the foregoing values are merely exemplary and that the invention is not limited thereto.

FIGURE 4 illustrates a scale-of-two or binary counter employing a multivibrator according to the invention, i.e. that of FIGURE 1, combined with appropriate complementing circuitry to cause the appropriate switching transistor 52 or 54 to be triggered by successive input pulses. More particularly to afford binary counting the triggering circuit of FIGURE 1 has been modified in the following manner:

Battery 48, instead of being connected by way of a low-resistance conductor to the emitter electrodes 64 and 66 of third and fourth transistors 52 and 54 as in FIGURE 1, is now connected thereto by way of a triggering transistor 130. The latter transistor comprises a base element 132 having the same conductivity type of that of the other transistors, i.e. n-type in the specific arrangement shown, a base electrode 134 connected to element 132, an emitter electrode 136 and a collector electrode 138. Emitter electrode 136 is connected directly to the positive pole 46 of battery 48, and collector electrode 138 is connected directly to the emitter electrodes 64 and 66 of third and fourth transistors 52 and 54 respectively. To maintain triggering transistor 130 in a normally non-conductive condition a resistive element 140 is connected between its base and emitter electrodes 134 and 136. In addition a blocking capacitor 142 is connected between base electrode 134 and an input terminal 144.

Furthermore a complementing or memory circuit is provided, which comprises a source of a potential positive with respect to reference potential. In the arrangement of FIGURE 4 this source comprises the positive terminal 146 of a battery 148 having its negative terminal 150 connected to a point at reference potential. The memory circuit also comprises two voltage dividers, one comprising resistive elements 152 and 154 connected serially and in the order named between collector electrode 20 of first transistor 10 and the positive terminal 146 of battery 148, and the other comprising resistive elements 156 and 158 connected serially and in the order named between collector electrode 28 of second transistor 12 and positive terminal 146 of battery 148. In the specific symmetrical arrangement here shown resistive elements 152 and 156 have substantially equal resistances, and resistive elements 154 and 158 have substantially equal resistances. The junction 160 of resistive elements 156 and 158 is directly connected to base electrode 60 of third transistor 52, and the junction 162 of resistive elements 152 and 154 is directly connected to base electrode 62 of fourth transistor 54. In addition resistive elements 152 and 156 are respectively shunted by speed-up capacitors 164 and 166.

In operation the aforedescribed memory circuit determines which one of gating transistors 52 and 54 will be actuated by an input pulse supplied to triggering transistor 130. In particular this circuit operates to cause transistors 52 and 54 alternately to be actuated in response to successive negative-going input pulses supplied to input terminal 144. For example assume that first transistor 10 is initially conductive and second transistor 12 is initially non-conductive. Under these conditions the potential of collector electrode 20 to which resistive element 152 is connected is only slightly negative with respect to reference potential. By contrast the potential of collector electrode 28 to which resistive element 156 is connected is considerably negative with respect to referenc potential, being nearly equal to the voltage of battery 34. In addition batteries 34, 48 and 148 have voltages and resistive elements 152, 154, 156 and 158 have resistances such that under the foregoing conditions junction 162 supplies to base electrode 62 of fourth transistor 54 a potential positive with respect to that of positive terminal 46 of battery 48, whereas junction 160 supplies to base electrode 60 of third transistor 52 a potential negative with respect to that of terminal 46.

Upon the application of a negative-going input pulse to base electrode 134 of triggering transistor 130 the emitter-collector resistance of transistor 130 changes from a very high to a very low value. As a result a potential very nearly equal to that of positive terminal 46 is applied to the emitter electrodes 64 and 66 of transistors 52 and 54. However because the base electrode 62 of fourth transistor 54 is now biased at a potential positive with respect to terminal 46, the latter transistor remains non-conductive. In contrast, because the base electrode 60 of third transistor 52 is now biased a potential negative with respect to that of terminal 46, the latter transistor immediately becomes heavily conducting. As a result its emitter-collector resistance falls to a very low value. Accordingly and as has been explained with respect to FIGURE 1 the hitherto conductive first transistor 10 is now rendered non-conductive, the emitter-base circuit thereof becomes an efficient drain for minority carriers stored in base element 14 and the collector potential of second transistor 12 is immediately established at the value which it will have when the latter transistor is fully conducting. In addition the increasingly negative collector potential of first transistor 10 is applied to base electrode 24 of second transistor 12 thereby to cause the latter transistor to conduct.

After this switching operation is completed, second transistor 12 becoming heavily conductive and first transistor 10 becoming substantially non-conductive, the memory circuit establishes the base electrode 62 of fourth transistor 54 at a potential negative with respect to that of terminal 46 and establishes the base electrode 60 of third transistor 52 at a potential positive in respect to that of terminal 46. Accordingly when triggering transistor 130 is next rendered conductive by a negative-going input pulse applied to its base electrode 134, fourth transistor 54 is now caused to conduct heavily and reverse the respective conduction states of the first and second transistors 10 and 12 in the manner just described.

In each instance speed-up capacitors 164 and 166 immediately transmit the transient changes in the potentials of collector electrodes 20 and 28 to the base electrodes 62 and 66 of gating transistors 54 and 52. As a result the circuit is rendered responsive to input pulses having a high repetition frequency. Because two negative-going input pulses must be supplied to input terminal 144 to cause the potential at the collector electrode of either the first or second transistor to change from its initial value to its alternate value and back to its initial value, the circuit of FIGURE 4 is a scale-of-two counter.

In a specific embodiment the components of the circuit of FIGURE 4 have the following values:

| | |
|---|---|
| Transistors 10, 12, 52, 54 and 130 | Each a Philco Type SB–100. |
| Resistors 30 and 32 | Each 330 ohms. |
| Resistors 40 and 42 | Each 680 ohms. |
| Resistor 140 | 1500 ohms. |
| Capacitor 142 | 1500 micromicrofarads. |
| Resistors 152 and 156 | Each 1000 ohms. |
| Resistors 154 and 158 | Each 10,000 ohms. |
| Capacitors 164 and 166 | Each 560 micromicrofarads. |
| Battery 34 | 3 volts. |
| Battery 48 | 6 volts. |
| Battery 148 | 22.5 volts. |

When the foregoing values are used the scale-of-two counter of FIGURE 4 can count reliably sine-wave input signals having frequencies as high as 55 megacycles per second.

In the foregoing discussion the transistors have all been described as having n-type base elements. However it is to be understood that transistors having p-type base elements may equally well be used. In such a case the polarity of each battery in the circuit should be reversed from that shown in the drawing and positive-going input pulses supplied thereto.

Moreover in each of the foregoing specific embodiments, the components associated with first and second transistors 10 and 12 having corresponding functions have been assigned substantially equal value so that the embodiment operates substantially symmetrically. However, it will be understood that these components may have unequal values where it is desired to produce outputs of unequal amplitude from the transistors.

Furthermore the switching means have been shown in FIGURES 1 and 2 as comprising transistors 52 and 54, in FIGURE 3 as additionally comprising transistors 90 and 92, and in FIGURE 4 as additionally comprising transistor 130. However any one or all of these transistors may be replaced by other forms of low-impedance switching apparatus preferably of the momentary contact type.

While I have described my invention with reference to several specific embodiments, I do not wish to be limited thereto, for obvious modifications will occur to those skilled in the art without departing from the scope of my invention.

What I claim is:

1. In a bistable transistor multivibrator comprising two transistors each adapted to conduct an emitter-collector current sufficient to saturate the conductive transistor, the other transistor concurrently conducting substantially no emitter-collector current, wherein the impedance of external circuit elements connected between the base and emitter elements of said conductive transistor is considerably larger than the internal impedance of said conductive transistor between said base and emitter elements, and wherein turn-off of said conductive transistor is effected by applying an appropriate switching potential thereto and tends to be delayed substantially beyond the termination of minority-carrier injection by said emitter element owing to storage of minority-carriers in said base element, a switching arrangement for effecting abrupt turn-off of said conductive transistor comprising means for applying a reverse-biasing voltage between said base and emitter elements of said conductive transistor and for concurrently reducing the external impedance between said base and emitter elements to a value substantially less than said internal impedance therebetween.

2. A transistor multivibrator comprising first and second transistors each having a base element, a base electrode connected thereto, an emitter electrode and a collector electrode, said base elements of said transistors having the same conductivity type; a resistive element for supplying an operating potential to said collector electrode of said first transistor; a resistive element for supplying an operating potential to said collector electrode of said second transistor; a resistive element connecting said collector electrode of said first transistor to said base electrode of said second transistor; a resistive element connecting said collector electrode of said second transistor to said base electrode of said first transistor; and gating means comprising a voltage source having a pair of output terminals and exhibiting a low internal resistance between said terminals, direct-current-conductive means of low impedance connecting one of said output terminals to said emitter electrodes, first switching means connecting the other of said output terminals to said base electrode of said first transistor, and second switching means connecting said other output terminal to said base electrode of said second transistor, each of said switching means normally having a high resistance but being controllable to have a low resistance, said voltage source being connected between said emitter electrodes and said two switching means in a polarity such as to apply a reverse-biasing voltage between said base and emitter electrodes of said first transistor when said first switching means is controlled to have its low resistance and to apply a reverse-biasing voltage between said base and emitter electrodes of said second transistor when said second switching means is controlled to have its low resistance.

3. A transistor multivibrator according to claim 2 wherein said high resistance of each of said first and second switching means is much greater than the resistance of the internal base-emitter path of each of said first and second transistors when conductive, and wherein the sum of said internal resistance of said voltage source, said low impedance of said direct-current-conductive means and said low resistance of either of said first and second switching means is substantially less than said internal base-emitter path resistance.

4. A transistor multivibrator according to claim 1, wherein said switching arrangement includes means for applying a forward-biasing voltage to said other transistor to effect rapid turn-on thereof.

5. A transistor multivibrator according to claim 2, wherein said resistive elements for supplying said operating potentials to said collector electrodes of said first and second transistors have substantially equal resistances, wherein said resistive element connecting said collector electrodes of said first transistor to said base element of said second transistor has a resistance substantially equal to the resistance of said resistive element connecting said collector electrode of said second transistor to said base electrode of said first transistor, and wherein said operating potentials respectively supplied to said collector electrodes of said first and second transistors have substantially the same value.

6. A transistor multivibrator according to claim 2, wherein said first switching means comprises a third transistor having a base element of said same conductivity type, a base electrode connected thereto, an emitter electrode and a collector electrode, direct-current conductive means of low impedance connecting said emitter electrode of said third transistor to said source, and direct-current conductive means of low impedance connecting said collector electrode of said third transistor to said base electrode of said first transistor; and wherein said second switching means comprises a fourth transistor having a base element of said same conductivity type, a base electrode connected thereto, an emitter electrode and a collector electrode, direct-current conductive means of low impedance connecting the last-named emitter electrode to said source, and direct-current conductive means of low impedance connecting the last-named collector electrode to said base electrode of said second transistor.

7. A transistor multivibrator according to claim 6, wherein said first switching means additionally comprises a resistive element connected between said base and emitter electrodes of said third transistor, and wherein said second switching means additionally comprises a resistive element connected between said base and emitter electrodes of said fourth transistor.

8. A transistor multivibrator according to claim 7, wherein said base elements of all of said transistors are composed of n-type semiconductive material, wherein said operating potentials respectively supplied to said collector electrodes of said first and second transistors are negative with respect to the potential of said emitter electrodes thereof, and wherein said voltage source has its negative output terminal connected to said emitter electrodes of said first and second transistors and its positive output terminal connected to said emitter electrodes of said third and fourth transistors.

9. A transistor multivibrator according to claim 8, wherein said resistive elements for supplying said operating potentials to said collector electrodes of said first and second transistors have substantially equal resistances, wherein said resistive element connecting said collector electrode of said first transistor to said base element of said second transistor has a resistance substantially equal to the resistance of said resistive element connecting said collector electrode of said second transistor to said base electrode of said first transistor, and wherein said operating potentials supplied to said collector electrodes of said first and second transistors have substantially the same value.

10. A transistor multivibrator according to claim 7, wherein said gating means additionally comprises fifth and sixth transistors each having a base element of said same conductivity type, a base electrode connected thereto, an emitter electrode and a collector electrode, a resistive element directly connecting said base electrode of said fifth transistor said emitter electrodes of said first and second transistors, a resistive element directly connecting said base electrode of said sixth transistor said emitter electrodes of said first and second transistors means interconnecting said base electrodes of said third and fifth transistors, means interconnecting said base electrodes of said fourth and sixth transistors, means for supplying to said collector electrodes of said fifth and sixth transistors a potential differing from the potential of said emitter electrodes of said first and second transistors and having a polarity such as to reverse-bias the base-collector path of each of said fifth and sixth transistors, direct-current conductive means connecting said emitter electrode of said fifth transistor to said base electrode of said second transistor, and direct-current conductive means connecting said emitter electrode of said sixth transistor to said base electrode of said first transistor.

11. A multivibrator according to claim 10, wherein said means interconnecting said base electrodes of said third and fifth transistors comprise a capacitor and a resistor connected in series relationship between the last-named base electrodes, and said means interconnecting said base electrodes of said fourth and sixth transistors comprise a capacitor and a resistor connected in series relationship between the last-named base electrodes.

12. A multivibrator according to claim 11, wherein said base elements of all said transistors are composed of n-type semiconductive material, wherein said operating potentials respectively supplied to said collector electrodes of said first, second, fifth and sixth transistors are negative with respect to said potential of said emitter electrodes of said first and second transistors, and wherein said voltage source has its negative terminal connected to said emitter electrodes of said first and second transistors and its positive terminal connected to said emitter electrodes of said third and fourth transistors.

13. A transistor multivibrator according to claim 12, wherein said resistive elements for supplying said operating potentials to said collector electrodes of said first and second transistors have substantially equal resistances, wherein said resistive element connecting said collector electrode of said first transistor to said base element of said second transistor has a resistance substantially equal to the resistance of said resistive element connecting said collector electrode of said second transistor to said base electrode of said first transistor, and wherein said operating potentials respectively supplied to said collector electrodes of said first and second transistors have substantially the same value.

References Cited in the file of this patent

UNITED STATES PATENTS

| | | |
|---|---|---|
| 2,670,445 | Felker | Feb. 23, 1954 |
| 2,884,518 | O'Neill | Apr. 28, 1959 |
| 2,885,574 | Roesch | May 5, 1959 |
| 2,892,100 | Huang et al. | June 23, 1959 |

OTHER REFERENCES

Hunter: Handbook of Semiconductor Electronics, McGraw-Hill, October 15, 1956, pp. 15-54 and 15-55.